United States Patent

Sakakima et al.

[11] Patent Number: 6,077,618
[45] Date of Patent: Jun. 20, 2000

[54] MAGNETO-RESISTANCE EFFECT ELEMENT, MAGNETO-RESISTANCE EFFECT TYPE HEAD, MEMORY ELEMENT, AND METHOD FOR MANUFACTURING THEM

[75] Inventors: Hiroshi Sakakima; Mitsuo Satomi, both of Osaka; Shinji Nagamachi; Masahiro Ueda, both of Kyoto, all of Japan

[73] Assignees: Shimadzu Corporation, Kyoto; Matsushita Electric Industrial Co., Ltd., Kadoma, both of Japan

[21] Appl. No.: 08/983,514

[22] PCT Filed: May 28, 1997

[86] PCT No.: PCT/JP97/01830

§ 371 Date: Jan. 28, 1998

§ 102(e) Date: Jan. 28, 1998

[87] PCT Pub. No.: WO97/45883

PCT Pub. Date: Dec. 4, 1997

[30] Foreign Application Priority Data

May 28, 1996 [JP] Japan .................................. 8-133841
Oct. 30, 1996 [JP] Japan .................................. 8-288638

[51] Int. Cl.[7] ........................................................ G11B 5/39
[52] U.S. Cl. ........................ 428/693; 324/252; 338/32 R; 360/113
[58] Field of Search ........................... 428/693; 324/252; 338/32 R; 360/113

[56] References Cited

U.S. PATENT DOCUMENTS 5,390,061  2/1995  Nakatani et al. .

FOREIGN PATENT DOCUMENTS 2-116181  4/1990  Japan .
4-103014  4/1992  Japan .

OTHER PUBLICATIONS

Patent Abstracts of Japan, Publishing No. 06244477, Sep. 2, 1994.

"Giant Magnetoresistance of (001) Fe/(001) Cr Magnetic Superlattices", M.N. Baibick et al., Physical Review Letters, vol. 61, No. 21, Nov. 21, 1988, The American Physical Society, pp 2471–2475.

(List continued on next page.)

*Primary Examiner*—Stevan A. Resan
*Attorney, Agent, or Firm*—Armstrong, Westerman, Hattori, McLeland & Naughton

[57] ABSTRACT

A magnetoresistance effect element, a head of the magnetoresistance effect type and a memory element in each of which a larger MR change can be acquired in a smaller magnetic field, and a method of producing the magnetoresistance effect element. In a magnetoresistance effect element, the basic structure comprises a lamination body of a magnetic layer/a nonmagnetic insulating layer/a magnetic layer, and a nonmagnetic insulating layer has, at an exposed part thereof, a conductive portion sufficiently smaller than the contact portion of the nonmagnetic insulating layer with respect to the magnetic layers, the conductive portion electrically connecting the magnetic layer to each other. Electrode lead portions are disposed at the upper and lower magnetic layers. In the lamination body, there may be formed, in the nonmagnetic insulating layer, a column-like conductive portion which is sufficiently smaller than the contact portion of the nonmagnetic insulating layer with respect to the magnetic layers. The nonmagnetic insulting layer may be formed of an oxide or nitride of a conductive material, and the conductive portion may be lower in oxide concentration or nitride concentration than the nonmagnetic insulating layer. Further, the basic structure may include a lamination body consisting of a conductive magnetization-reversal restraining layer/a magnetic layer/a nonmagnetic insulating layer/a magnetic layer in which the conductive magnetization-reversal restraining layer is formed on the surface of one of the magnetic layers for restraining the one magnetic layer from being reversed in magnetization direction.

14 Claims, 8 Drawing Sheets

OTHER PUBLICATIONS

"Magnetic Tunneling Effect in Ferromagnet/Al$^2$O$_3$/Ferromagnet Junctions", N. Tezuka et al., Faculty of Engng., Tohoku Univ., Aoba–ku, Sendai 980–77, (1995) vol. 19, No. 2, pp 369–372.

"Oscillations in Exchange Coupling and magnetoresistance in Metallic Superlattice Structures: Co/Ru, Co/Cr, and Fe/Cr", S.S. P. Parkin et al., Physical Review Letters, vol. 64, No. 19, May 7, 1990, The American Physical –2253. Society, pp 2304 2307.

"Write Stability of 2.0×20$\mu$m$^2$ M–R Memory Cells", A.V. Pohm et al., Department of Electrical Eng. and Computer Eng., Iowa State Univer, Ames IA 50010, IEEE Transactions of Magnetics, vol. 27, No. 6, Nov. 1991, pp. 5520–5523.

"Spin–valve effect in soft ferromagnetic sandwiches", B. Dieny et al. Journal of Magnetism and Magnetic Materials 93, (1991) pp 101–104; North Holland, Elservier Science Publishers B.V.

"Large Magnetoresistance of Field–Induced Giant Ferrimagnetic Multilayers", Teruya Shinjo et al., vol. 59, No. 9, Sep. 1990, Journal of the Physical Society of Japan, pp 3061–3064.

"Geometrically enhanced magnetoresistance in ferromagnet–insulator–ferromagnet tunnel junctions", J.S. Moodera et al., Appl. Phys. Lett 69, (5), Jul. 29, 1996, The American Institute of Physics, pp 708–710.

(a)

(b)

MAGNETO-RESISTANCE EFFECT ELEMENT, MAGNETO-RESISTANCE EFFECT TYPE HEAD, MEMORY ELEMENT, AND METHOD FOR MANUFACTURING THEM

BACKGROUND OF THE INVENTION

1. Field of the Invention

The present invention relates to a magnetoresistance effect element, a head of the magnetoresistance effect element type and a memory element and also relates to a method of producing the magnetoresistance effect element mentioned aboved.

2. Description of the Related Art

It has recently been discovered that an artificial lattice layer [Fe/Cr] or [Co/Ru] in which the magnetic layers are antiferromagnetically coupled to each other through a metallic nonmagnetic layer of Cr, Ru or the like, produces a giant magnetoresistance effect in a ferromagnetic field (1 to 10 kOe (PHYSICAL REVIEW LETTERS, Vol. No. 21, p2472–2475, 1988, PHYSICAL REVIEW LETTERS, Vol. No. 19, p2304–2307, 1990). The artificial lattice layer according to the technology above-mentioned, shows a large change in magnetoresistance (hereinafter referred to as MR). However, since the magnetic layers are antiferromagnetically coupled to each other, the magnetic field required for producing an MR effect is as big as several kOe. This is practically disadvantageous.

A giant magnetoresistance effect has been discovered also in an artificial lattice layer [Ni—Fe/Cu/Co] using two different types of magnetic layers of Ni—Fe and Co which are separated from each other through a metallic nonmagnetic layer Cu and which are weak in magnetic coupling. That is, there has been obtained an artificial lattice layer of which MR rate is about 8% in a magnetic field applied at room temperature of 0.5 kOe (Journal of The Physical Society of Japan, Vol. 59, No. 9, September,1990, pp. 3061–3064). However, even in this artificial lattice layer, it is difficult to intercept perfectly the magnetic coupling between the magnetic layers. Thus, it has been desired to develop a magnetoresistance effect element which shows a greater MR change in a smaller applied magnetic field.

When an electric current flows in the vertical direction of the layer surface, the element presents a large MR change. However, since the artificial lattice layer above-mentioned is very thin, the resistance in the vertical direction of the layer surface is very low. This is practically disadvantageous.

As an artificial lattice layer operable in a very small applied magnetic field, there is proposed a layer of the spin valve type in which an antiferromagnetic material of Fe—Mn is attached to a body of Ni—Fe/Cu/Ni—Fe (Journal of Magnetism and Magnetic Materials 93, p.101–104, 1991), and it is now studied to apply this layer to a head of the magnetoresistance effect type. However, the arrangement according to this technology is disadvantageous in view of MR change as small as 2 to 4%.

Further, there has been developed a tunnel-type magnetoresistance effect element using an insulating layer between two magnetic layers (Nihon Ohyo Jiki Gakkaishi Vol. 19, No. 2, p369–372, 1995). According to this technology, however, it is difficult to control the quality of the insulating layer. This makes it difficult to produce such elements having good reproducibility in characteristics.

There is proposed a memory element having word lines and sense lines each made of a conventional MR material (IEEE TRANSACTIONS ON MAGNETICS, VOL. 27, NO. 6, P5520–5522, 1991). This memory element is small in MR change rate such that the information reading output is disadvantageously small.

To solve the problems above-mentioned, the present invention is proposed with the object of providing a magnetoresistance effect element, a head of the magnetoresistance effect type and a memory element in each of which a larger MR change can be acquired in a smaller magnetic field, and also providing a method of producing the magnetoresistance effect element above-mentioned.

SUMMARY OF THE INVENTION

To achieve the object above-mentioned, the present invention provides a magnetoresistance effect element having a basic structure comprising a lamination body of [a magnetic layer/a nonmagnetic insulating layer/a magnetic layer], in which the nonmagnetic insulating layer has, at an exposed part thereof, a conductive portion sufficiently smaller than the contact portion of the nonmagnetic insulating layer with respect to the magnetic layers, the conductive portion electrically connecting the magnetic layers to each other, and in which electrode lead portions are respectively disposed at the upper and lower magnetic layers. In the basic structure comprising a lamination body of [a magnetic layer/a nonmagnetic insulating layer/a magnetic layer], there may be formed, in the nonmagnetic insulating layer, a column-like conductive portion sufficiently smaller than the contact portion of the nonmagnetic insulating layer with respect to the magnetic layers. The nonmagnetic insulating layer is preferably made of an oxide or nitride of a conductive material, and the conductive portion is preferably lower in oxygen concentration or nitrogen concentration than the nonmagnetic insulating layer.

The conductive portion formed in an exposed part of the insulating layer electrically connects the upper and lower magnetic layers to each other, thus forming a channel corresponding to tunneling. This improves the characteristics as compared with a tunnel-type giant magnetoresistance effect layer of prior art using only an insulating layer.

Further, a soft magnetic layer is preferably used for one of the magnetic layers adjacent to each other through the nonmagnetic insulating layer, and a magnetic layer greater in magnetic coercive force than the soft magnetic layer, is preferably used for the other magnetic layer. According to the arrangement above-mentioned, a very small signal magnetic field reverses the magnetization direction of the magnetic layer smaller in magnetic coercive force, i.e., the soft magnetic layer, into the applied magnetic field direction, but does not reverse the magnetization direction of the magnetic layer greater in magnetic coercive force, i.e., the hard magnetic layer. Thus, the magnetization directions of the both magnetic layers are anti-parallel to each other, increasing the element in resistance. This increases the MR change rate.

According to the present invention, the magnetoresistance effect element maybe arranged such that the basic structure comprises a lamination body of [a conductive magnetization-reversal restraining layer/a magnetic layer/a nonmagnetic insulating layer/a magnetic layer] in which the conductive magnetization-reversal restraining layer is formed on the surface of one of the magnetic layers for restraining the one magnetic layer from being reversed in magnetization direction, that the nonmagnetic insulating layer has, at an exposed part thereof, a conductive portion sufficiently smaller than the contact portion of the nonmagnetic insulating layer with respect to the magnetic layers, that the conductive portion electrically connects the magnetic layers to each other, and that electrode lead portions are respectively disposed at the upper and lower magnetic layers.

In the arrangement above-mentioned, too, (i) the nonmagnetic insulating layer may have a column-like conductive portion which is lower in oxygen concentration or nitrogen concentration than the nonmagnetic insulating layer, which is sufficiently smaller than the contact portion of the nonmagnetic insulating layer with respect to the magnetic layers, and which electrically connects the magnetic layers to each other, and (ii) electrode lead portions may be respectively disposed at the upper and lower magnetic layers. Preferably, the magnetization reversal restraining layer is a conductive antiferromagnetic layer.

According to the arrangement above-mentioned, due to the presence of the magnetization reversal restraining layer, the magnetic layer in contact therewith is not readily reversed in magnetization direction. Thus, the combination of the magnetization reversal restraining layer and the magnetic layer in contact therewith corresponds to a hard magnetic layer.

According to the present invention, at least one of the magnetic layers may be an amorphous alloy layer, and at the interface between the nonmagnetic insulating layer and at least one of the magnetic layers, there maybe formed an interface magnetic layer which contains Co or Fe as one of the main component elements and of which thickness is not greater than 2 nm. With such an arrangement, a greater MR change rate can be obtained.

The nonmagnetic insulating layer may be made of an oxide of Nb.

According to the arrangement above-mentioned, the special nonmagnetic insulating layer separates the soft magnetic layer to be easily reversed in magnetization direction even in a very small magnetic field, from the magnetic layer not to be easily reversed in magnetization direction in a very small magnetic field. This extremely weakens the magnetic coupling between the magnetic layers, enabling the soft magnetic layer to be successfully reversed in magnetization direction. This improves the element in sensitivity of magnetic field. Further, there can be obtained, in the vertical direction of the layer surface, a magnetoresistance effect in which a greater MR change rate is obtained.

A head of the magnetoresistance effect type according to the present invention, comprises a magnetoresistance effect element of the present invention and is arranged such that the magnetic field direction of a signal from a magnetic medium to be detected, is parallel to the easy magnetization axis of one of the magnetic layers, and is at a right angle to the easy magnetization axis of the other magnetic layer.

With the arrangement above-mentioned, there can be obtained a head of the magnetoresistance effect type in which the output is great and of which linearity is good.

A memory element according to the present invention comprises a magnetoresistance effect element of the present invention, and is arranged such that there are disposed, through an insulating layer, word lines each of which is formed of a conductive line and which are arranged to generate an information recording magnetic field in the vicinity of the magnetoresistance effect element, and that there are disposed information reading sense lines each of which is formed of a conductive line and which connect the electrode lead portions to each other. Preferably, the memory element comprises a plurality of magnetoresistance effect elements each of which is according to the present invention and which are disposed in the form of a matrix, and is arranged such that there are disposed, in the vicinity of each of the magnetoresistance effect elements, two insulated word lines at right angles to each other, and that there are disposed sense lines each of which is formed of a conductive line and which connect, to each other, the electrode lead portions formed on and under each of the magnetoresistance effect elements.

According to the head of the magnetoresistance effect type of the present invention and the memory element of the present invention, the resistance is high also in the vertical direction of the layer surface, enabling an electric current to flow in the vertical direction of the layer surface of the element. Thus, a greater MR change rate can be obtained.

According to the present invention, a method of producing a magnetoresistance effect element is characterized in that a high-speed ion beam or a high-speed neutral particle beam is irradiated to the nonmagnetic insulating layer which is made of an oxide or nitride of a conductive material and which is held by and between the two magnetic layers, such that there is formed, in the beam irradiated portion of the nonmagnetic insulating layer, a conductive portion which is lower in oxygen concentration or nitrogen concentration than the nonmagnetic insulating layer and which is sufficiently smaller in area than the contact portion of the nonmagnetic insulating layer with respect to the magnetic layers, the conductive portion electrically connecting the two magnetic layers to each other.

BEST MODES FOR CARRYING OUT THE INVENTION

Figure 1:
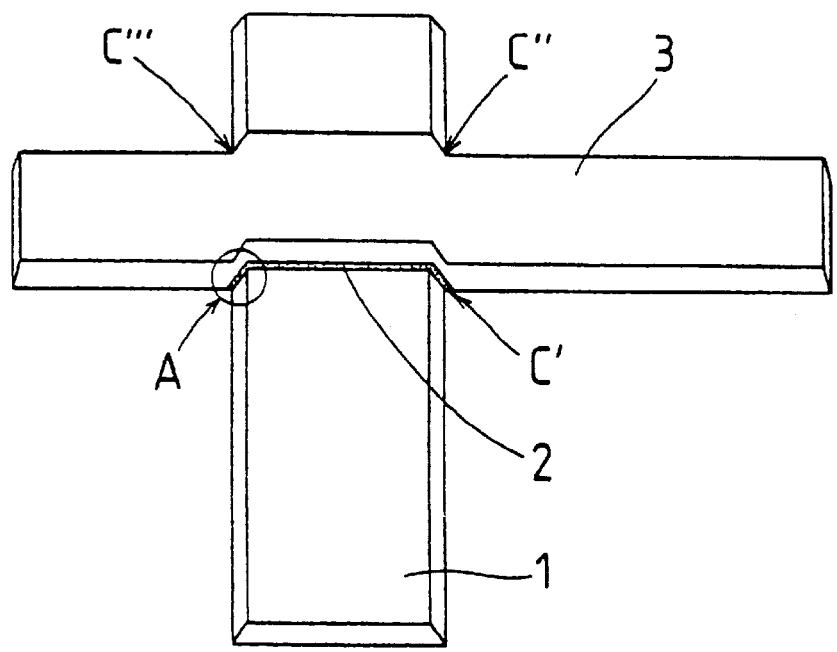
FIG. 1(a) is a perspective view illustrating the arrangement of a magnetoresistance effect element according to an embodiment of the present invention.
FIG. 1(b) is an enlarged view of a main portion A in FIG. 1(a)
Figure 1:
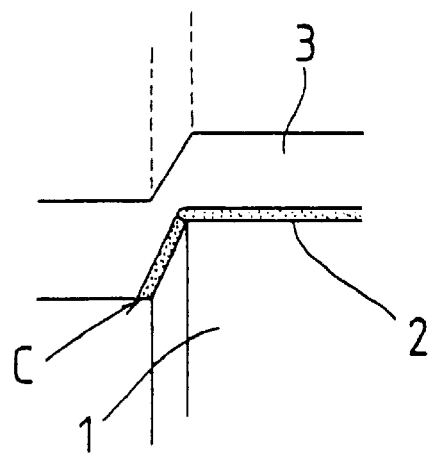

Referring to the attached drawings, the following description will discuss preferred embodiments of the present invention.

FIG. 1(a) is a perspective view illustrating the arrangement of a magnetoresistance effect element according to an embodiment of the present invention, and FIG. 1(b) is an enlarged view of a main portion A in FIG. 1(a).

According to this embodiment, the magnetoresistance effect element has a basic structure of [a magnetic layer 3/a nonmagnetic layer 2/a magnetic layer 1] and is provided, at each of edge portions C', C'', C''' of exposed portions of the nonmagnetic layer 2, with a conductive portion C considerably smaller than the contact portion of the nonmagnetic layer 2 with respect to the magnetic layer 3. These conductive portions C cause the magnetic layers 3, 1 to be electrically connected to each other. Electrode lead portions (not shown) are disposed at the upper and lower magnetic layers 3, 1.

The following description will discuss the operational principle of the magnetoresistance effect element having the arrangement above-mentioned.

When a small magnetic field H is applied, the magnetization direction of a magnetic layer small in magnetic coercive force, i.e. a soft magnetic layer (for example, the magnetic layer 1 in FIG. 1), is reversed into the applied magnetic field direction. However, a magnetic layer high in magnetic coercive force, i.e., a hard magnetic layer (for example, the magnetic layer 3 in FIG. 1), is not reversed in magnetization direction. When the magnetization direction of the hard magnetic layer is anti-parallel to the applied magnetic field direction, the magnetization directions of the both magnetic layers are anti-parallel to each other to increase the element in resistance. When the applied magnetic field is further strengthened, the magnetization directions of the both magnetic layers become parallel to each other to reduce the element in resistance.

According to the prior art, it is difficult to intercept the magnetic coupling between the magnetic layers when metal is used for a nonmagnetic layer, and by increasing the thickness of the metallic nonmagnetic layer, the magnetic coupling can be intercepted but the MR change rate is lowered. Further, an insulating body may be used for the nonmagnetic layer and provision may be made such that an electric current flows with the use of the tunnel effect in the vertical direction of the layer surface. However, such an arrangement lowers the reproducibility of characteristics dependent on the quality or the like of the insulating layer.

According to this embodiment, the conductive portions C are formed at exposed portions of the nonmagnetic layer 2. It is therefore possible to solve the above-mentioned problems of the prior art. Further, the tunnel effect of the nonmagnetic insulating layer according to this embodiment, is controllable by using a magnetoresistance effect element producing method to be discussed later. This facilitates the element designing.

Figure 2:
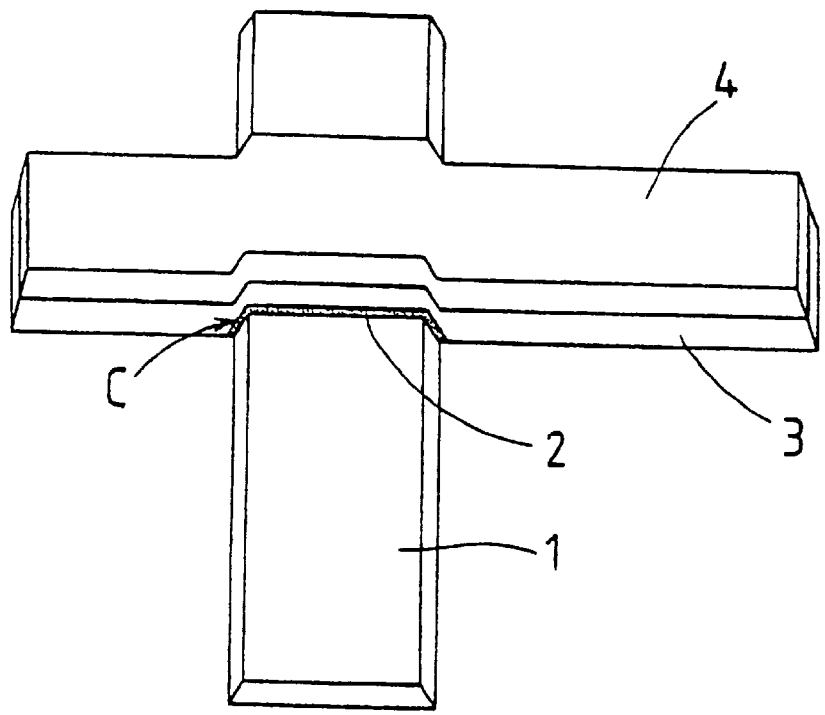
FIG. 2 is a perspective view illustrating the arrangement of a magnetoresistance effect element according to another embodiment of the present invention.

According to the present invention, the basic structure is not limited to the lamination body of [the magnetic layer 3/the nonmagnetic layer 2/the magnetic layer 1] in FIG. 1, but may be a lamination body of [a magnetization reversal restraining layer 4/a magnetic layer 3'/a nonmagnetic layer 2/a magnetic layer 1] as shown in FIG. 2. Because of the presence of the magnetization reversal restraining layer 4, the magnetic layer 3' is not readily reversed in magnetization direction. That is, the arrangement of the magnetization reversal restraining layer 4 and the magnetic layer 3' corresponds to the arrangement of the magnetic layer 3 in FIG. 1. Therefore, the magnetic layer 3' may be or may not be the same as the magnetic layer 1.

Further, two or more magnetoresistance effect elements each having any of the basic structures above-mentioned may be laminated through each insulating layer such as the nonmagnetic layer 2 or the like.

Further, there may be disposed, at the interface between a magnetic layer and the nonmagnetic layer, an interface magnetic layer which contains Co or Fe as one of the main component elements and of which thickness is not greater than 2 nm. With such an arrangement, a larger MR change rate can be obtained.

Figure 3:
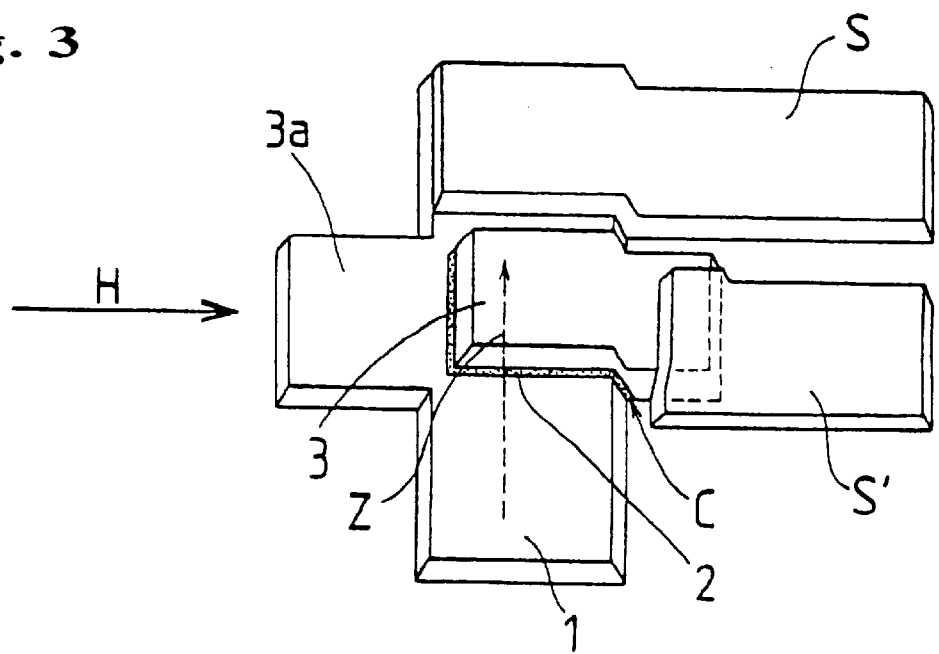
FIG. 3 is a perspective view illustrating the arrangement of a head of the magnetoresistance effect type according to an embodiment of the present invention.

FIG. 3 is a perspective view illustrating the arrangement of a head of the magnetoresistance effect type according to the present invention.

This head of the magnetoresistance effect type uses a magnetoresistance effect element having a basic structure of [a magnetic layer 3/a nonmagnetic layer 2/a magnetic layer 1]. In this head, the magnetic field H of a signal from a magnetic medium is at a right angle to an easy magnetization axis Z of the soft magnetic layer 1 of the magnetoresistance effect element, and is parallel to an easy magnetization axis of the magnetic layer 3. The soft magnetic layer 1 is provided at a portion thereof with a projection 3a which projects in parallel to the signal magnetic field H. This efficiently detects the signal magnetic field H. The soft magnetic layer 1 and the magnetic layer 3 have lead electrode portions S, S', respectively, such that changes in resistance between the layers 1, 3 are detected. According to the arrangement above-mentioned, this head of the magnetoresistance effect type is excellent in linearity, low in noise and high in output. As apparent from FIG. 3, the present invention is characterized in that, even though the shape of a patterned magnetic layer is anisotropic, the magnetic field direction to be detected and the easy magnetization axial direction of the magnetic layers can readily be controlled. The arrangement in FIG. 3 utilizes the fact that the longitudinal direction of the patterned magnetic layer serves as the easy magnetization axis. Preferably, the other magnetic layer 3 is large in magnetic coercive force to prevent the reversal of magnetization direction in the signal magnetic field. Further, to obtain a larger MR change rate, the magnetic layer 3 is preferably a hard magnetic layer presenting a magnetization curve of which square shape ratio (residual magnetization/saturated magnetization) is not less than at least 0.7.

There can also be obtained a similar head of the magnetoresistance effect type with the use of a magnetoresistance effect element having a structure of [a magnetization reversal restraining layer 4/a magnetic layer 3'/a nonmagnetic layer 2/a magnetic layer 1.

Figure 4:
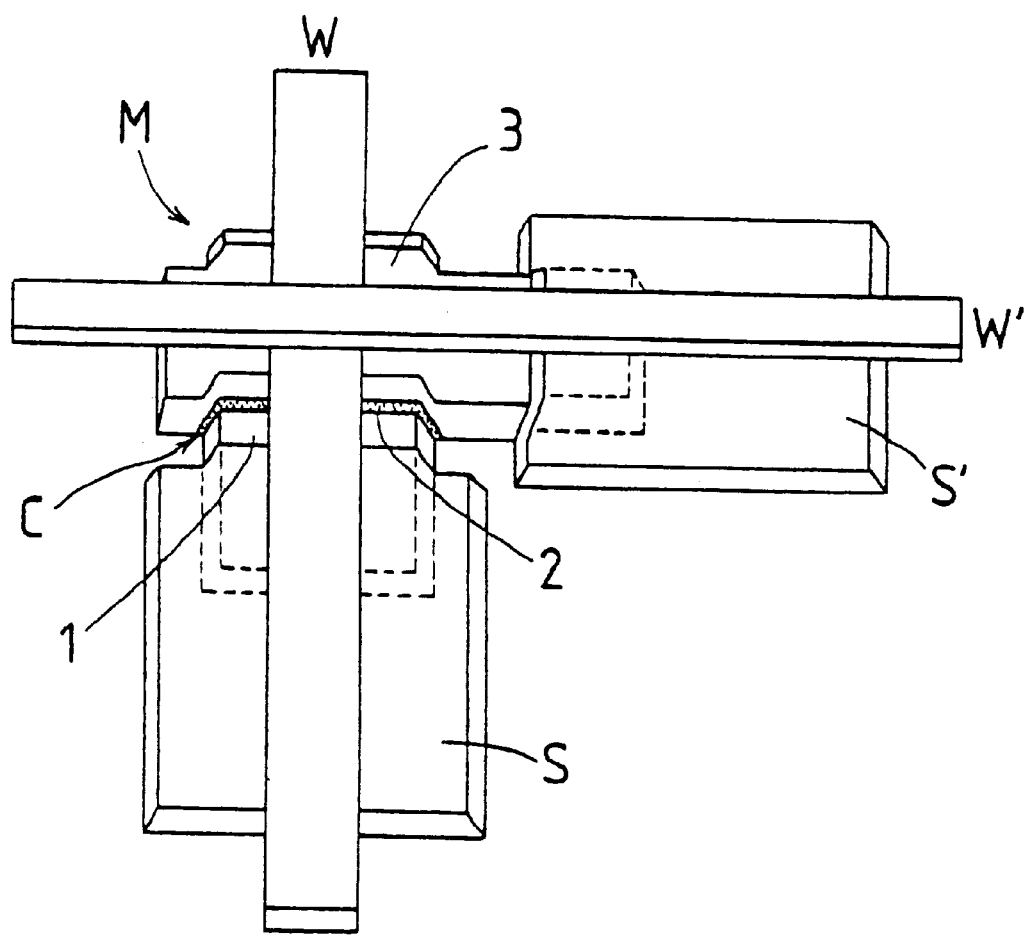
FIG. 4 is a perspective view illustrating the arrangement of a memory element according to an embodiment of the present invention.

FIG. 4 is a perspective view illustrating the arrangement of a memory element according to the present invention.

In a magnetoresistance effect element unit M (the intersecting portion of magnetic layers 3, 1 including a nonmagnetic layer 2 in FIG. 4), lead electrode portions S, S' are connected to each other by conductive lines serving as sense lines. In the vicinity of the magnetoresistance effect element unit M, there are disposed, through an insulating layer, word lines W, W' for recording information. The following description will discuss the operational principle of the memory element having the arrangement above-mentioned.

For recording information, provision is made such that an electric current flows in the word lines W, W' and that, in the magnetoresistance effect element of the type (the magnetic layer 3/the nonmagnetic layer 2/the magnetic layer 1], the magnetic layer 3 larger in magnetic coercive force is reversed in magnetization direction to record the information. For reading information, provision is made such that a weak electric current flows in the word lines W, W', that only the magnetic layer 1 smaller in magnetic coercive force is reversed in magnetization direction and that the changes in magnetoresistance generated in the magnetoresistance effect element unit M are detected by the sense lines to read the information. In this memory element, the magnetic layer 3 larger in magnetic coercive force is required to be reversed in magnetization direction by the magnetic field generated by the word lines. Accordingly, if the magnetic layer 3 is too large in magnetic coercive force, the reversal of magnetization direction is difficult. Thus, the magnetic layer 3 is preferably a semi-hard magnetic layer of which magnetic coercive force is suitable in magnitude. Further, to clarify the information recording state, the magnetization curve of the semi-hard magnetic layer is preferably good in square shape properties.

In the magnetoresistance effect element unit which has a structure [a magnetization reversal restraining layer 4/a magnetic layer 3'/a nonmagnetic layer 2/a magnetic layer 1] and in which particularly the magnetization reversal restraining layer 4 is made of an anti-ferromagnetic body, it is often difficult to reverse the magnetic layer 3' in magnetization direction by the magnetic field generated by the electric current flowing in the word lines. In such a case, provision is made such that, for recording information, an electric current flows in the word lines to reverse the magnetization direction of the magnetic layer 1 for recording the information, and that, for reading information, an electric current flows in the word lines to reverse the magnetization direction of the magnetic layer 1 for reading the information. Thus, nondestructive reading is executed in the structure [the magnetic layer 3/the nonmagnetic layer 2/the magnetic layer 1] mentioned earlier, but destructive reading is executed in the structure [the magnetization reversal restraining layer 4/the magnetic layer 3'/the nonmagnetic layer 2/the magnetic layer 1].

Figure 5:
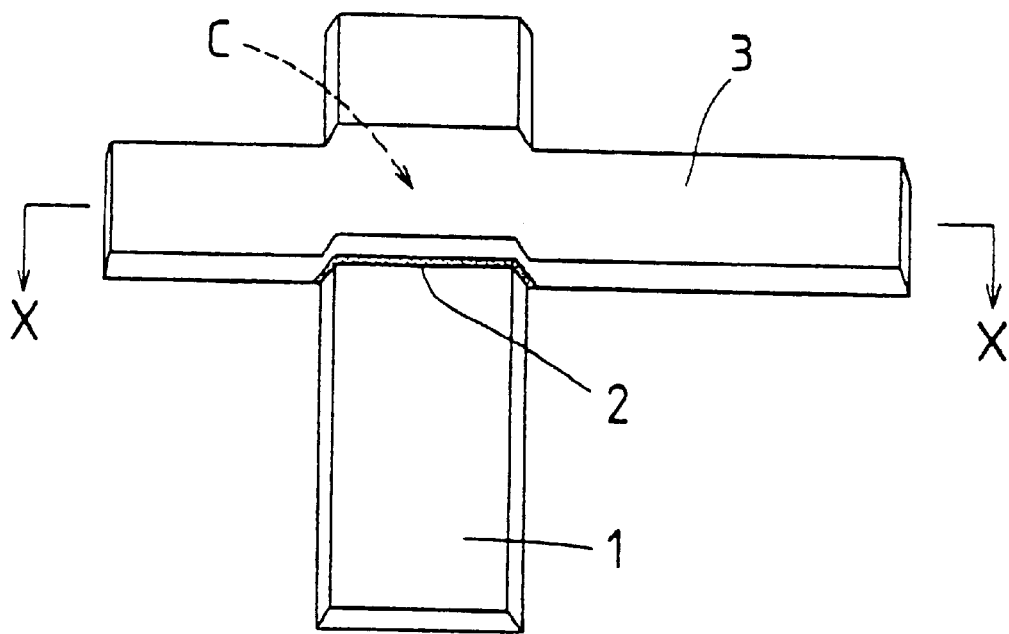
FIG. 5(a) is a perspective view illustrating the arrangement of a magnetoresistance effect element according to a further embodiment of the present invention.
FIG. 5(b) is a section view taken along the line X—X in FIG. 5(a)
Figure 5:
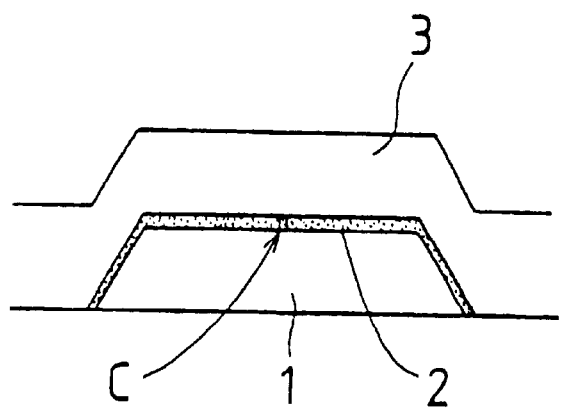

In each of the embodiments above-mentioned, there is shown an arrangement having the conductive portions C at the exposed portions of the nonmagnetic layer 2. However, the present invention is not limited to this arrangement, but as shown in FIGS. 5(a) and (b), the present invention may be arranged such that a column-like conductive portion C locally passing through the nonmagnetic layer 2, is formed in the nonmagnetic layer 2 held by and between the magnetic layers 1 and 3. This arrangement produces an operational effect similar to that produced by each of the embodiments above-mentioned.

Figure 6:
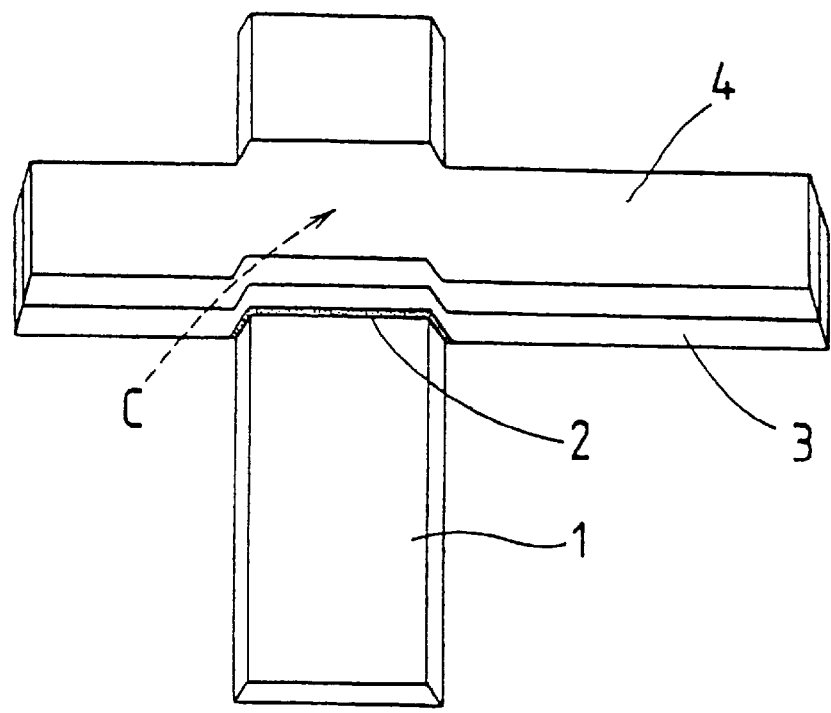
FIG. 6 is a perspective view illustrating the arrangement of a magnetoresistance effect element according to still another embodiment of the present invention.
Figure 7:
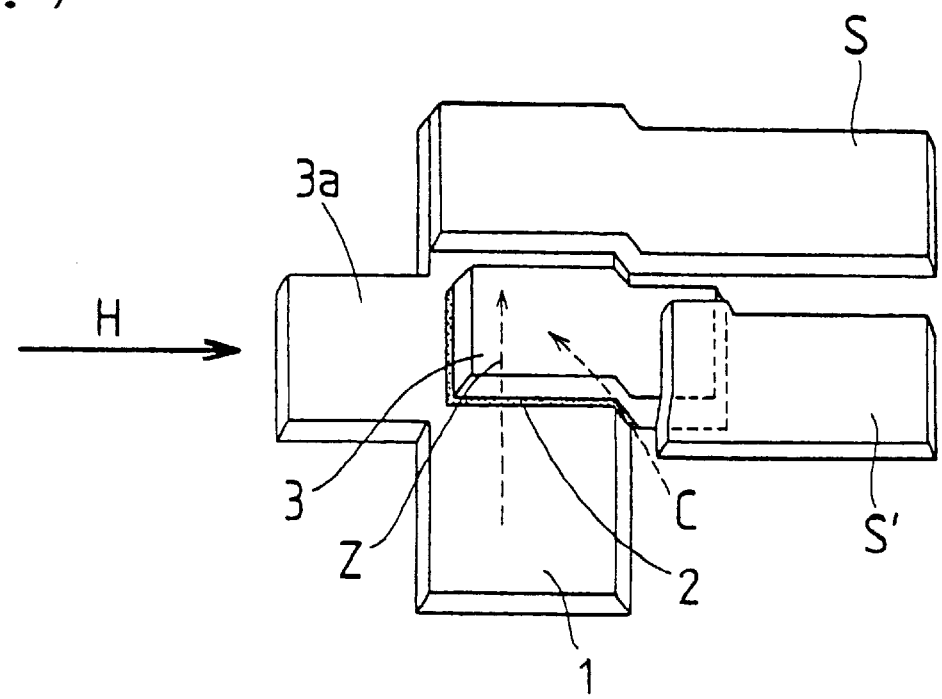
FIG. 7 is a perspective view illustrating the arrangement of a head of the magnetoresistance effect type according to another embodiment of the present invention.
Figure 8:
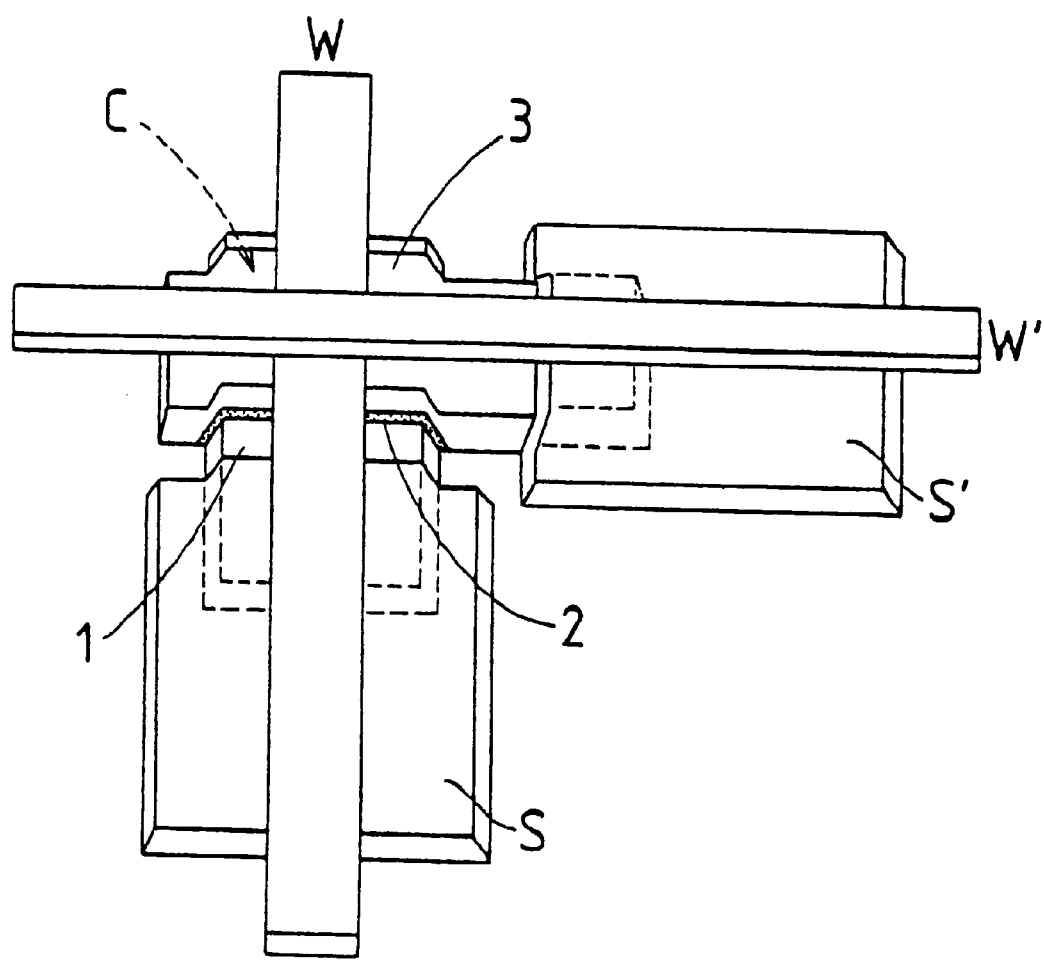
FIG. 8 is a perspective view illustrating the arrangement of a memory element according to another embodiment of the present invention.

FIGS. 6 to 8 show respective embodiments which adopt, in the respective embodiments in FIG. 2 to FIG. 4, the above-mentioned arrangement having a column-like conductive portion C, as shown in FIGS. 5(a) and (b), formed in the nonmagnetic insulating layer 2 held by and between the magnetic layers 1, 3 or 1, 3'.

According to the present invention, each of the soft magnetic layer 1, the (semi-)hard magnetic layer 3, the conductive magnetization reversal restraining layer 4 and the nonmagnetic insulating layer 2 forming the magnetoresistance effect element, is preferably arranged in the following manner.

As the soft magnetic layer 1, there is preferably used a Ni-rich magnetic layer made of, as the main component, $Ni_xCo_yFe_z$ which readily undergoes a change in magnetoresistance, which is readily reversed in magnetization direction in a low magnetic field, and which has an atomic composition of X=0.6 to 0.9, Y=0 to 0.4 and Z=0 to 0.3. Typical examples of the material $Ni_xCo_yFe_z$ include $Ni_{0.8}Co_{0.15}Fe_{0.05}$, $Ni_{0.68}Co_{0.2}Fe_{0.12}$ and the like. Also, there may be used a Co-rich magnetic layer made of, as the main component, $Ni_{x'}Co_{y'}Fe_{z'}$, of which change in magnetoresistance is larger even though the operational magnetostriction is slightly larger, and which has an atomic composition of X'=0 to 0.4, Y'=0.2 to 0.95, Z'=0 to 0.5. Typical examples of this material $Ni_{x'}Co_{y'}Fe_{z'}$ include $Co_{0.09}Fe_{0.1}$, $Co_{0.7}Ni_{0.1}Fe_{0.2}$ and the like. The magnetic layer made of each of the materials above-mentioned is small in magnetostriction and is therefore practically effective as the material of an magnetoresistance effect element. In addition to the soft magnetic layer above-mentioned, an amorphous alloy layer maybe used. Since such an amorphous alloy layer presents soft magnetism even though extremely thin, it is possible to reduce the thickness of the magnetoresistance effect element in its entirety. Typical examples of the amorphous alloy include CoMnB, CoFeB, CoNbB and the like.

Further, a Fe-type layer may be used. When a Fe-type layer is used, a large MR change rate can be obtained even though the magnetostriction is not zero. Dependent on conditions, there can be produced a Fe-type layer relatively small or large in magnetostriction. Accordingly, a Fe-type layer may be used either as a soft magnetic layer or as a semi-hard magnetic layer as will be later discussed.

As the (semi-)hard magnetic layer 3, there is preferably used a magnetic layer of which magnetic coercive force is relatively large and which has a square-shape magnetization curve such that the magnetization direction of the layer is not reversed in a magnetic field to be detected. In order that the magnetoresistance effect element produces a great magnetoresistance effect, Fe or Co is preferably contained as one of the main component elements. Typical examples of Fe and Co include Co, $Co_{0.5}Fe_{0.5}$, $Co_{0.75}Pt_{0.25}$ and the like.

As the conductive magnetization reversal restraining layer 4, there may be used any layer as far as the layer produces an effect of restraining the magnetic layer 3' from being reversed in magnetization direction when the layer is attached to the magnetic layer 3'. Examples of such a layer include an antiferromagnetic layer of IrMn, NiMn or the like, and a hard magnetic layer of TbCo, SmCo or the like.

As the interface magnetic layer, a layer containing Co or Fe is effective for improving the MR change rate. However, when the interface magnetic layer is disposed at the interface between the magnetic layer 1 and the nonmagnetic layer 2, the interface magnetic layer has preferably a thickness of not greater than 2 nm such that the soft magnetism of the magnetic layers is not lost.

As the nonmagnetic insulating layer 2, there may be used an oxide layer of AlO, NbO or the like. When ions are irradiated and injected to this oxide layer, oxygen in the layer at its injected portions recoils. This forms low oxygen-concentration zones lower in oxygen concentration than the original nonmagnetic insulating layer 2, and these zones serve as conductive portions. Such an effect is produced remarkably in an oxide layer of Nb. However, even in a nitride insulating layer, when ions are irradiated and injected to this layer, there are formed low nitrogen-concentration zones lower in nitrogen concentration than the nonmagnetic insulating layer 2 and these zones serve as conductive portions. Thus, the nonmagnetic insulating layer 2 may be any layer as far as a conductive portion can be formed in the layer due to recoiling of oxygen, nitrogen or the like.

The conductive lines for word lines and sense lines are preferably made of metal low in resistance. Examples of such metal include Au, Cu and the like.

The mechanism of how a fine conductive portion is formed in the nonmagnetic insulating layer by irradiating and injecting ions thereto, would be considered as follows.

Injected ions come into collision with oxygen (nitrogen) atoms and metallic atoms in the nonmagnetic insulating layer, and the ions give kinetic energy to the metallic atoms and oxygen (nitrogen) atoms. The metallic atoms and the oxygen (nitrogen) atoms which start executing a motion, are moved by respective ranges determined by the masses and kinetic energies of the atoms, and then stop when the energies are consumed. Such a range is longer as the mass is smaller. The thickness of the nonmagnetic insulating layer is set to a value not less than the range of the oxygen (nitrogen) atoms and not greater than the range of the metallic atoms. In this case, low oxygen-concentration (low nitrogen-concentration) zones lower in oxygen-(nitrogen-) concentration than the insulating layer are locally generated in the insulating layer at ion-beam irradiated parts thereof, and serve as conductive layers. Since the ion beam itself has an own range, the conductive zones are determined by the thickness of the insulating layer and the ion beam range.

Figure 10:
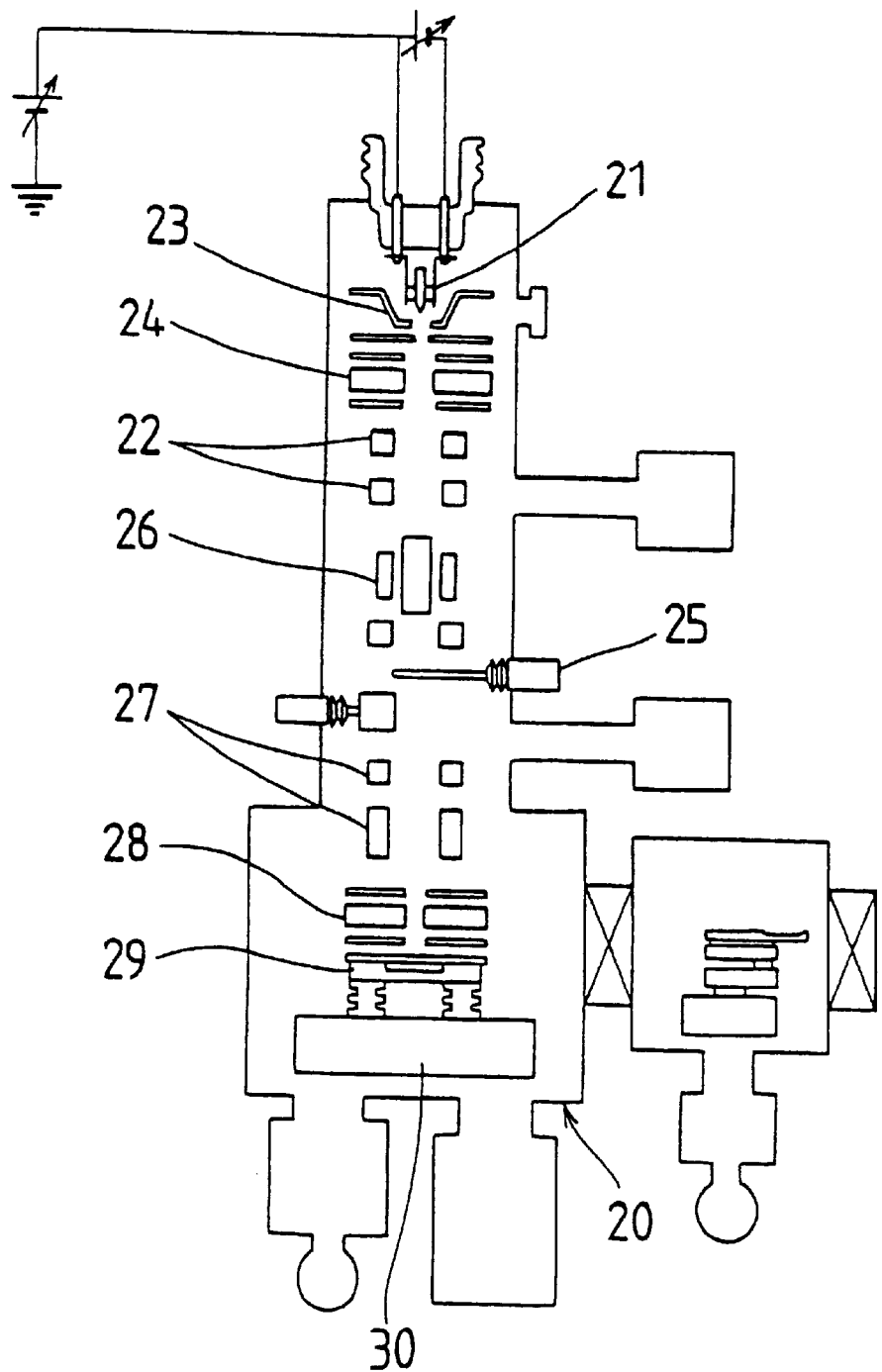
FIG. 10 is a vertical section view schematically illustrating the arrangement of a focused ion beam apparatus suitable for production of a magnetoresistance effect element according to the present invention.

In the structure of [the magnetic layer 3/the nonmagnetic layer 2/the magnetic layer 1] as shown in FIG. 1, the thickness of the nonmagnetic layer 2 at its portion on the top of the magnetic layer 1, is greater than the range of a high-speed ion beam, and the thickness of the nonmagnetic layer 2 at its portions C, C' on the lateral sides of the magnetic layer 1, is so set as to satisfy the condition above-mentioned. In this case, when a high-speed ion beam is irradiated to the whole surfaces of the magnetoresistance effect element, fine conductive layers are formed at the four edge portions (C, C', C'', C''') according to the mechanism above-mentioned. As to the sizes of each conductive layer, the section is shown by C in the enlarged view in FIG. 1(b) and the depth corresponds to the beam injecting depth. These sizes are determined by the thickness of the soft magnetic layer 1, the thickness of the nonmagnetic insulating layer and the energy of the injected beam. It is therefore possible to easily control these sizes with high precision of the nanometer order. Using a mask or a focused ion beam apparatus as shown in FIG. 10, the irradiation position of a high-speed ion beam can be limited. Thus, a conductive layer may also be formed at each of desired one to three portions only out of the four edge portions C, C', C'', C'''.

In the structure of [the magnetic layer 3/the nonmagnetic layer 2/the magnetic layer 1] as shown in FIGS. 5(a), (b), a focused high-speed ion beam may be irradiated to the nonmagnetic layer 2 at its portion on the top of the magnetic layer 1 before the magnetic layer 3 is formed. In this case, a fine column-like conductive layer is formed at the irradiated portion C. The sizes of the conductive layer are determined by the thickness of the nonmagnetic layer 2 and the sizes of the injected beam. It is therefore possible to easily control the sizes of the conductive layer with high precision of the nanometer order.

With reference to FIG. 10, the following description will discuss an example of a focused ion beam apparatus suitable for the production of the magnetoresistance effect element of the present invention.

In this example, the focused ion beam apparatus comprises a liquid metal ion source 21 to be heated by a heater, a lead electrode 23 disposed in the vicinity of an ion outlet port, a condenser lens 24 for focusing ions from the ion source 21, an ExB mask filter 26 and a beam aperture 25 which serve as a mass analyzing device, deflection electrodes 27 for scanning the beam, an objective lens 28 for focusing the ion beam immediately before a substrate (not shown) which is the target, a sample holder 29 for supporting the substrate, and a sample stage 30 for supporting the sample holder 29. The focused ion beam apparatus is housed in a vacuum chamber 20.

Using the focused ion beam apparatus having the arrangement above-mentioned, a column-like conductive portion as shown in FIGS. 5(a), (b) can locally be formed.

When forming a conductive layer throughout a predetermined zone as shown in FIG. 1 to FIG. 4, the focused ion beam apparatus is not required to be used, but there may be used apparatus capable of injecting ions to the predetermined zone. Further, a neutral beam may be used as far as the beam is a particle beam having a constant energy.

The following description will discuss specific examples of the present invention.

EXAMPLE 1

Figure 9:
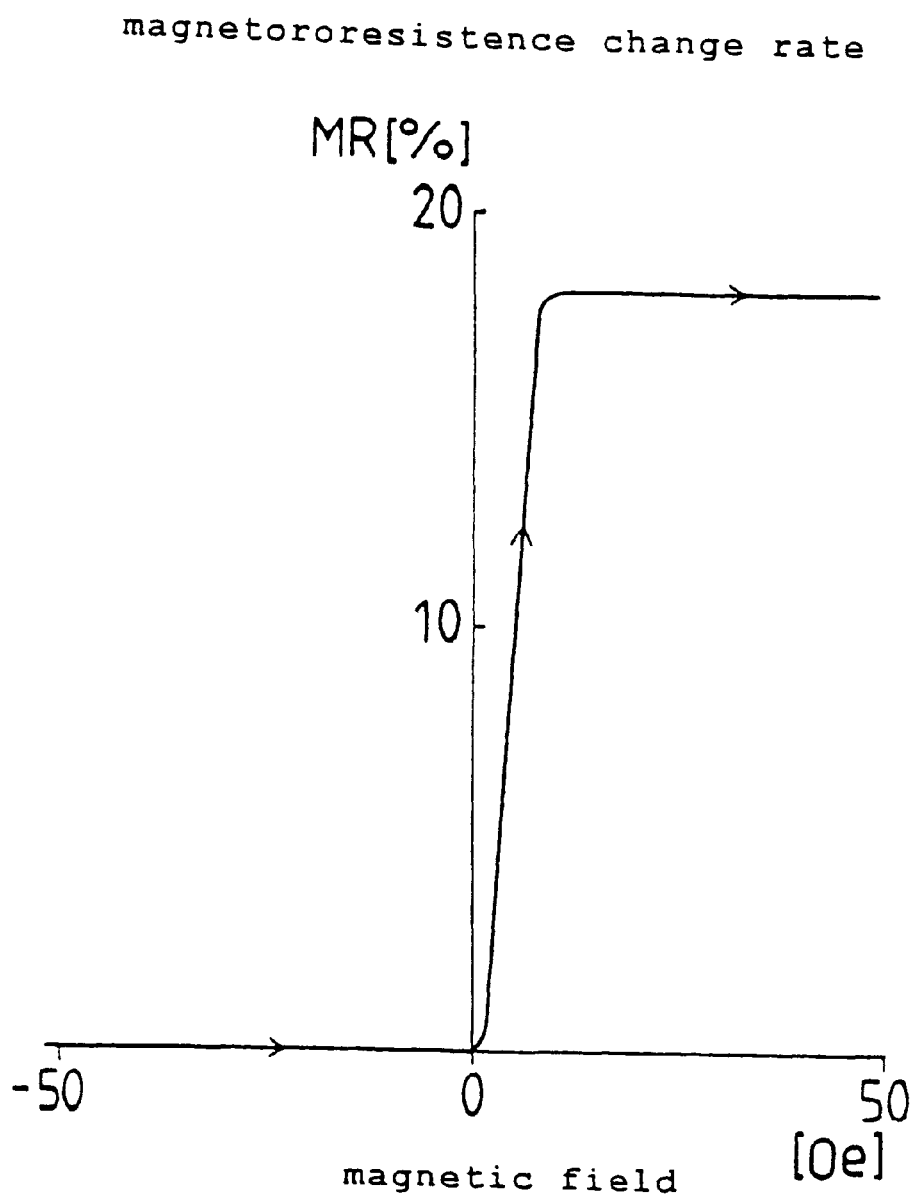
FIG. 9 is a view illustrating the magnetoresistance change rate of the magnetoresistance effect element of Example 1.

By sputtering, $Ni_{0.68}Co_{0.2}Fe_{0.12}$ was evaporated to form a layer having a thickness of 12 nm as the magnetic layer 1, and an oxide layer of Nb having a thickness of 10 nm was then formed. The oxide layer was patterned in the form of a stripe. Thereafter, an oxide layer of Nb having a thickness of 5 nm was formed. Thus, a nonmagnetic insulating layer 2 having a thickness of 15 nm was formed on the top of the magnetic layer 1, and a nonmagnetic insulating layer 2 having a thickness of 5 nm was formed on each of the lateral sides of the magnetic layer 1. By sputtering, $Co_{0.5}Fe_{0.5}$ was evaporated to form a layer having a thickness of 2 nm as the magnetic layer 3. Thereafter, this layer was patterned such that the insulating layer 2 was exposed as shown in FIG. 1. An ion beam having energy of 5 kev ~50 kev was irradiated to the exposed insulating layer to form conductive portions C as shown in FIG. 1, thus forming a tunnel-type magnetoresistance effect element. With an electric current flowing in the lead electrode portions of the magnetic layers 1, 3, the characteristics of MR change in the vertical direction of the layer surface were measured. The results are shown in FIG. 9. As apparent from FIG. 9, a MR change of 18% was obtained with a magnetic field of 50 Oe applied.

EXAMPLE 2

By sputtering, $Co_{0.72}Mn_{0.08}B_{0.20}$ was evaporated to form a layer having a thickness of 2 nm as the magnetic layer 1. Using a method identical with that shown in Example 1, the magnetic layer 1 was patterned and a nonmagnetic insulating layer 2 was formed. By sputtering, Co was evaporated to form a layer having a thickness of 2 nm as the magnetic layer 3', and IrMn was evaporated to form a layer having a thickness of 10 nm as the magnetization reversal restraining layer 4. Thereafter, the layer was patterned such that the insulating layer was exposed as shown in FIG. 2. Ions were irradiated and injected to the exposed insulating layer to form conductive portions C as shown in FIG. 2. With an electric current flowing in the electrodes, the characteristics of MR change in the vertical direction of the layer surface were measured. An MR change rate of 10% was obtained with a magnetic field of 20 Oe applied in the magnetic field direction to be detected.

EXAMPLE 3

By sputtering, $Ni_{0.8}Fe_{0.2}$ was evaporated to form a layer having a thickness of 10 nm as the magnetic layer 1. Using a method identical with that shown in Example 1, the magnetic layer 1 was patterned and a nonmagnetic insulating layer 2 was formed. By sputtering, Co was evaporated to form a layer having a thickness of 5 nm as the magnetic layer 3. Thereafter, this layer was patterned such that the insulating layer was exposed as shown in FIG. 3. Ions were irradiated and injected to the exposed insulating layer to form conductive portions C as shown in FIG. 3. Electrode portions S, S' were respectively disposed on the lower and upper magnetic layers, thus forming a head of the magnetoresistance effect type. With a magnetic field of 10 Oe applied to the head in the magnetic field direction to be detected, the generated output was measured. According to the measurement result, it was found that the output of the head of Example 3 was 6 times the output of a head having a similar shape and using Ni—Fe layers of conventional MR materials.

EXAMPLE 4

By sputtering, $Ni_{0.8}Fe_{0.2}$ was evaporated to form a layer having a thickness of 10 nm as the magnetic layer 1. Using a method identical with that shown in Example 1, the magnetic layer 1 was patterned and a nonmagnetic insulating layer 2 was formed. By sputtering, Co was evaporated to form a layer having a thickness of 5 nm as the magnetic layer 3. Thereafter, this layer was patterned such that the insulating layer was exposed as shown in FIG. 4. Ions were irradiated and injected to the insulating layer to form conductive portions C as shown in FIG. 4. Electrodes were respectively disposed on the upper and lower magnetic layers, and sense lines were formed. Thereafter, $SiO_2$ was sputtered to form an insulating layer, and Au was evaporated and patterned. Word lines were then formed. Thus, a memory element was prepared. An electric current was let flow in the word lines to magnetize the magnetic layer 3 in one direction. Then, a weak electric current for generating a magnetic field in the direction opposite to the magnetization direction of the magnetic layer 3 in order to reverse the magnetization direction of the magnetic layer 1 only, was let flow in the word lines, and the changes in resistance of the sense lines were measured. The measurement results showed that the output underwent a change. When a weak electric current for generating a magnetic field in the magnetization direction of the magnetic layer 3, was let flow in the word lines, the sense lines underwent no change in output. Thus, it was understood that the prepared memory element operated as a memory element. Further, even though a weak current was let flow, several times, in the word lines to read information, the output underwent a change. Thus, it was understood that nondestructive reading can be made.

EXAMPLE 5

By sputtering, $Ni_{0.68}Co_{0.2}Fe_{0.12}$ was evaporated to form a layer having a thickness of 12 nm as the magnetic layer 1, and an oxide layer of Nb having a thickness of 10 nm was then formed. This layer was patterned in the form of a stripe. Thus, a nonmagnetic insulating layer 2 having a thickness of 10 nm was formed on the top of the magnetic layer 1. A focused ion beam having energy of 5 keV~50 keV was irradiated to the insulating layer to form a conductive portion C as shown in FIGS. 5(a) and (b). By sputtering, $Co_{0.5}Fe_{0.5}$ was evaporated to form a layer having a thickness of 2 nm as the magnetic layer 3. Then, this layer was patterned and made in the shape as shown in FIGS. 5(a) and (b). Thus, there was formed a tunnel-type magnetoresistance effect element. With an electric current flowing in the lead electrode portions of the magnetic layers 1, 3, the characteristics of MR change in the vertical direction of the layer surface were measured. An MR change rate of 18% was obtained with a magnetic field of 50 Oe applied.

EXAMPLE 6

By sputtering, $Co_{0.72}Mn_{0.08}B_{0.20}$ was evaporated to form a layer having a thickness of 2 nm as the magnetic layer 1. Using a method identical with that shown in Example 5, the magnetic layer 1 was patterned and a nonmagnetic insulating layer 2 was formed. Focused ions were irradiated and injected to the insulating layer to form a conductive portion C. By sputtering, Co was evaporated to form a layer having a thickness of 2 nm as the magnetic layer 3', and IrMn was evaporated to form a layer having a thickness of 10 nm as the magnetization reversal restraining layer 4. Thereafter, the layers were patterned into the shapes as shown in FIG. 6. Lead electrodes were disposed on the magnetic layers 1 and 3'. With an electric current flowing in the electrodes, the characteristics of MR change in the vertical direction of the layer surface were measured. An MR change rate of 10% was obtained with a magnetic field of 20 Oe applied.

EXAMPLE 7

By sputtering, $Ni_{0.8}Fe_{0.2}$ was evaporated to form a layer having a thickness of 12 nm as the magnetic layer 1. Using a method identical with that shown in Example 5, the magnetic layer 1 was patterned and a nonmagnetic insulating layer 2 was formed. By sputtering, $Co_{0.5}Fe_{0.5}$ was evaporated to form a layer having a thickness of 2 nm as the magnetic layer 3. Thereafter, this layer was patterned into the shapes as shown in FIG. 7. Wirings shown by electrodes S, S' were installed, thus forming a head of the magnetoresistance effect type. With a magnetic field of 10 Oe applied to the head in the magnetic field direction to be detected, the generated output was measured. According to the measurement result, it was found that the output of the head of Example 7 was 6 times the output of a head having a similar shape and using Ni—Fe layers of conventional MR materials.

EXAMPLE 8

By sputtering, $Ni_{0.8}Fe_{0.2}$ was evaporated to form a layer having a thickness of 10 nm as the magnetic layer 1. Using a method identical with that shown in Example 5, the magnetic layer 1 was patterned and a nonmagnetic insulating layer 2 was formed. Focused ions were irradiated and injected to the insulating layer to form a conductive portion C. By sputtering, Co was evaporated to form a layer having a thickness of 5 nm as the magnetic layer 3. The layers were patterned into the shapes as shown in FIG. 8. Electrodes were respectively disposed on the upper and lower magnetic layers and sense lines were formed. Thereafter, $SiO_2$ was sputtered to form an insulating layer, and Au was evaporated and patterned. Word lines were then formed. Thus, a memory element was prepared. An electric current was let flow in the word lines to magnetize the magnetic layer 3 in one direction. Then, a weak electric current for generating a magnetic field in the direction opposite to the magnetization direction of the magnetic layer 3 in order to reverse the magnetization direction of the magnetic layer 1 only, was let flow in the word lines, and the changes in resistance of the sense lines was measured. The measurement results showed that the output underwent a change. When a weak electric current for generating a magnetic field in the magnetization direction of the magnetic layer 3, was let flow in the word lines, the sense lines underwent no change in output. Thus, it was understood that the prepared memory element operated as a memory element. Further, even though a weak electric current was let flow, several times, in the word lines to read information, the output underwent a change. Thus, it was understood that nondestructive reading can be made.

What is claimed is:

1. A magnetoresistance effect element having a basic structure comprising a magnetic layer/nonmagnetic insulating layer/magnetic layer lamination body, characterized in that:

said nonmagnetic insulating layer has, at an exposed part thereof, a conductive portion sufficiently smaller than the contact portion of said nonmagnetic insulating layer with respect to said magnetic layers and having a thickness sufficient to electrically connect said magnetic layers to each other;

electrode lead portions are respectively disposed at said magnetic layers by and between which said nonmagnetic insulating layer is held; and provision is made such that the resistance of said magnetoresistance effect element is reduced when the magnetization directions of said magnetic layers are parallel to each other, and that said resistance is increased when said magnetization directions are antiparallel to each other.

2. A magnetoresistance effect element having a basic structure comprising a magnetic layer/nonmagnetic insulating layer/magnetic layer lamination body, characterized in that:

said nonmagnetic insulating layer has a column-like conductive portion sufficiently smaller than the contact portion of said nonmagnetic insulating layer with respect to said magnetic layers and having a thickness sufficient to electrically connect said magnetic layers to each other;

electrode lead portions are respectively disposed at said magnetic layers by and between which said nonmagnetic insulating layer is held; and provision is made such that the resistance of said magnetoresistance effect element is reduced when the magnetization directions of said magnetic layers are parallel to each other, and that said resistance is increased when said magnetization directions are antiparallel to each other.

3. A magnetoresistance effect element according to any of claims 1 and 2, wherein said nonmagnetic insulating layer is made of an oxide or nitride of a conductive material, and said conductive portion is lower in oxygen concentration or nitrogen concentration than said nonmagnetic insulating layer.

4. A magnetoresistance effect element according to any of claims 1, and 2 wherein a soft magnetic layer is used for one of said magnetic layers adjacent to each other through said nonmagnetic insulating layer, and a magnetic layer greater in magnetic coercive force than said soft magnetic layer, is used for the other magnetic layer.

5. A magnetoresistance effect element having a basic structure comprising a conductive magnetization-reversed restraining layer/magnetic layer/nonmagnetic insulating layer/magnetic layer lamination body in which said conductive magnetization-reversal restraining layer is formed on the surface of one of said magnetic layers for restraining said one magnetic layer from being reversed in magnetization direction, characterized in that:

said nonmagnetic insulating layer has, at an exposed part thereof, a conductive portion sufficiently smaller than the contact portion of said nonmagnetic insulating layer with respect to said magnetic layers and having a thickness sufficient to electrically connect said magnetic layers to each other;

electrode lead portions are respectively disposed at said magnetic layers by and between which said nonmagnetic insulating layer is held; and provision is made such that the resistance of said magnetoresistance effect element is reduced when the magnetization directions of said magnetic layers are parallel to each other, and that said resistance is increased when said magnetization directions are antiparallel to each other.

6. A magnetoresistance effect element having a basic structure comprising a conductive magnetization-reversed restraining layer/magnetic layer/nonmagnetic insulating layer/magnetic layer lamination body in which said conductive magnetization-reversal restraining layer is formed on the surface of one of said magnetic layers for restraining said one magnetic layer from being reversed in magnetization direction, characterized in that:

said nonmagnetic insulating layer has a column-like conductive portion which is lower in oxygen concentration or nitrogen concentration than said nonmagnetic insulating layer, which is sufficiently smaller than the contact portion of said nonmagnetic insulating layer with respect to said magnetic layers and having a thickness sufficient to electrically connect said magnetic layers to each other;

electrode lead portions are respectively disposed at said magnetic layers by and between which said nonmagnetic insulating layer is held; and provision is made such that the resistance of said magnetoresistance effect element is reduced when the magnetization directions of said magnetic layers are parallel to each other, and that said resistance is increased when said magnetization directions are antiparallel to each other.

7. A magnetoresistance effect element according to any of claims 5 and 6, wherein said magnetization-reversal restraining layer is made of a conductive antiferromagnetic material.

8. A magnetoresistance effect element according to any of claims 1, 2, 5 and 6, wherein at least one of said magnetic layers is an amorphous alloy layer.

9. A magnetoresistance effect element according to any of claims 1, 2, 5 and 6, further comprising, at the interface between said nonmagnetic insulating layer and at least one of said magnetic layers, an interface magnetic layer which contains Co or Fe as one of the main component elements and of which thickness is not greater than 2 nm.

10. A magnetoresistance effect element according to any of claims 1, 2, 5 and 6 wherein said nonmagnetic insulating layer is made of an oxide of Nb.

11. A head of the magnetoresistance effect type, comprising a magnetoresistance effect element according to any of claims 1, 2, 5 and 6, characterized in that the magnetic field direction of a signal from a magnetic medium to be detected, is parallel to the easy magnetization axis of one of the magnetic layers and is at a right angle to the easy magnetization axis of the other magnetic layer.

12. A memory element comprising a magnetoresistance effect element according to any of claims 1, 2, 5 and 6, characterized in that there are disposed, through an insulating layer, word lines each of which is formed of a conductive line and which are arranged to generate an information recording magnetic field in the vicinity of said magnetoresistance effect element, and that there are disposed information reading sense lines each of which is formed of a conductive line and which connect the electrode lead portions to each other.

13. A memory element comprising a plurality of magnetoresistance effect elements each according to any of claims 1, 2, 5 and 6, characterized in that said magnetoresistance effect elements are disposed in the form of a matrix, that there are disposed, in the vicinity of each of said magnetoresistance effect elements, two insulated word lines at right angles to each other, and that there are disposed sense lines each of which is formed of a conductive line and which connect, to each other, the electrode lead portions formed on and under each of said magnetoresistance effect elements.

14. A method of producing a magnetoresistance effect element according to any of claims 1, 2, 5 and 6, characterized in that a high-speed ion beam or a high-speed neutral particle beam is irradiated to the nonmagnetic insulating layer which is made of an oxide or nitride of a conductive material and which is held by and between the two magnetic layers, such that there is formed, in the beam irradiated portion of said nonmagnetic insulating layer, a conductive portion which is lower in oxygen concentration or nitrogen concentration than said nonmagnetic insulating layer and which is sufficiently smaller in area than the contact portion of said nonmagnetic insulating layer with respect to said magnetic layers, said conductive portion electrically connecting said two magnetic layers to each other.

* * * * *